(12) United States Patent
Saitoh et al.

(10) Patent No.: US 6,191,005 B1
(45) Date of Patent: Feb. 20, 2001

(54) PROCESS FOR PRODUCING SEMICONDUCTOR DEVICE

(75) Inventors: Yutaka Saitoh; Jun Osanai, both of Chiba (JP)

(73) Assignee: Seiko Instruments Inc. (JP)

(*) Notice: Under 35 U.S.C. 154(b), the term of this patent shall be extended for 0 days.

(21) Appl. No.: 08/524,382

(22) Filed: Sep. 6, 1995

(30) Foreign Application Priority Data

Sep. 7, 1994 (JP) .................................... 6-213639
Aug. 11, 1995 (JP) .................................... 7-206324

(51) Int. Cl.[7] .................................... H01L 21/76
(52) U.S. Cl. .................... 438/439; 438/143; 438/297; 438/402; 438/471
(58) Field of Search .................................... 438/143, 297, 438/402, 439, 447, 471

(56) References Cited

U.S. PATENT DOCUMENTS

| | | | | |
|---|---|---|---|---|
| 4,548,654 | * | 10/1985 | Tobin | 438/471 |
| 4,931,405 | * | 6/1990 | Kamijo et al. | 438/476 |
| 5,262,338 | * | 11/1993 | Fusegawa et al. | 438/585 |
| 5,502,010 | * | 3/1996 | Nadahara | 438/477 |
| 5,506,176 | * | 4/1996 | Takizawa | 438/477 |
| 5,506,178 | * | 4/1996 | Sizuki et al. | 438/477 |
| 5,620,932 | * | 4/1997 | Fujimaki | 438/770 |
| 5,701,088 | * | 12/1997 | Fujimaki | 324/765 |

* cited by examiner

Primary Examiner—Trung Dang
(74) Attorney, Agent, or Firm—Adams & Wilks

(57) ABSTRACT

A process for producing a semiconductor device comprises heat-treating an oxygen-containing silicon substrate in an inert atmosphere to change a concentration of oxygen contained in the silicon substrate to within a range of $5\times10^{17}/cm^3$ to $10\times10^{17}/cm^3$, and heat treating the silicon substrate in an oxidative atmosphere to form a silicon oxide film.

15 Claims, 15 Drawing Sheets

(800°C in $N_2$ atmosphere)

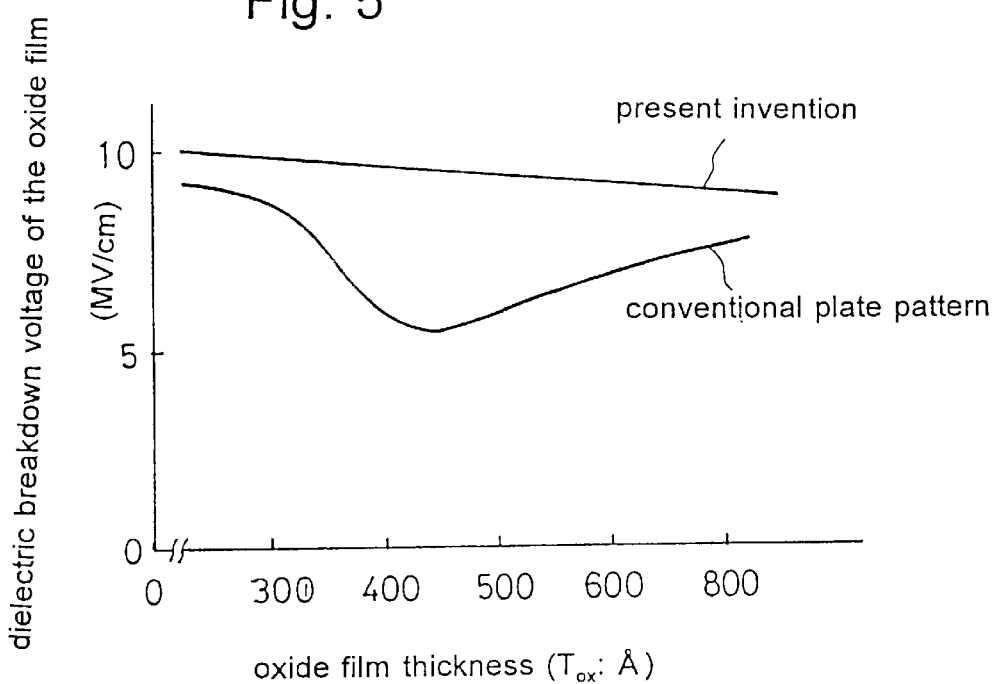
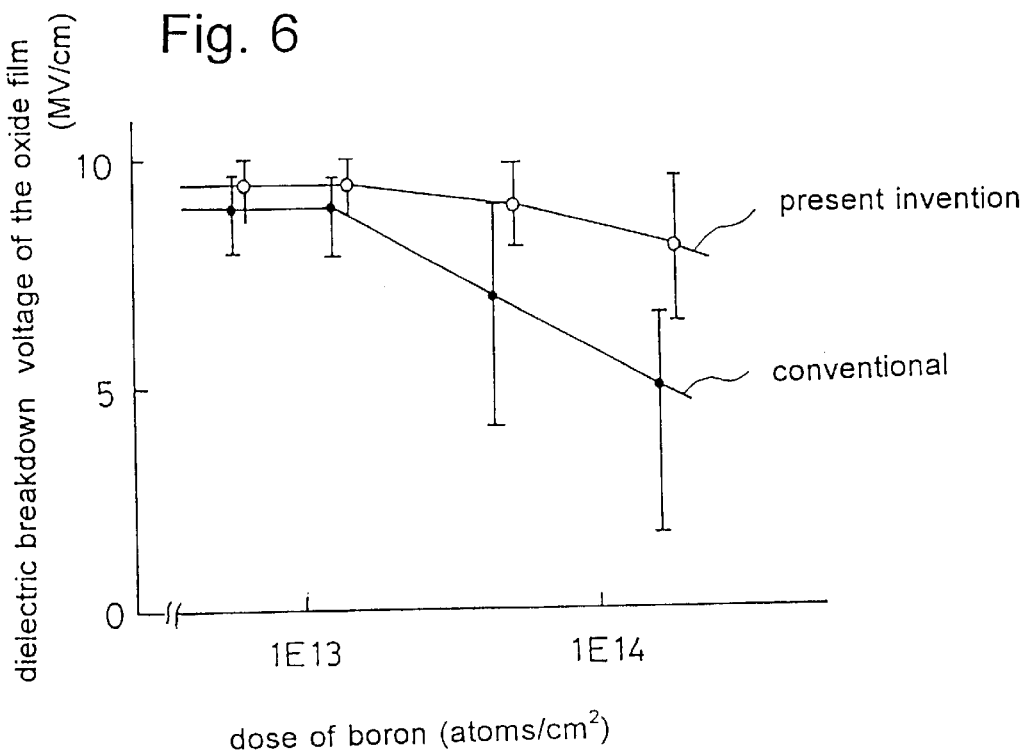

Fig. 8B dielectric breakdown voltage of the oxide film (MV/cm)

mode A    mode B    mode C intrinsic dielectric breakdown voltage of the oxide film (MV/cm)

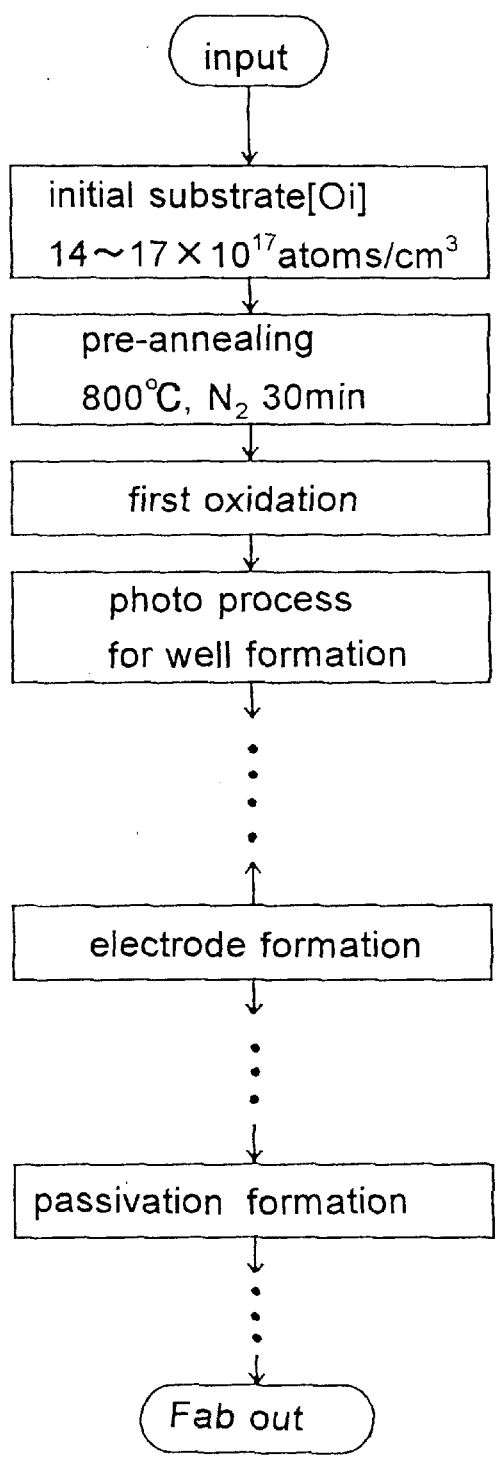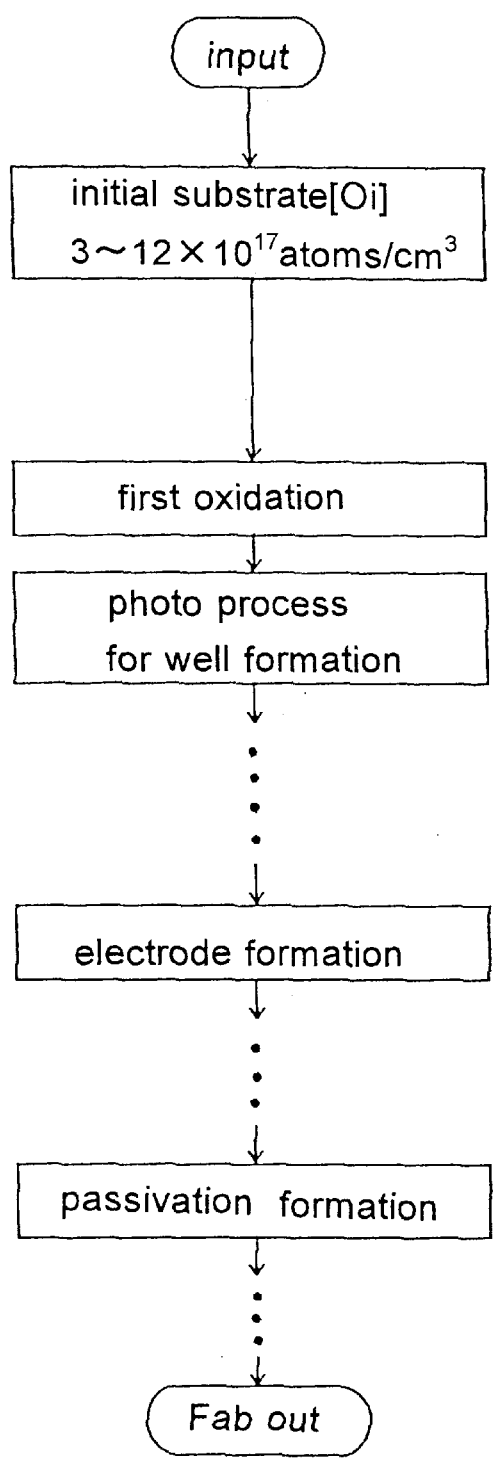

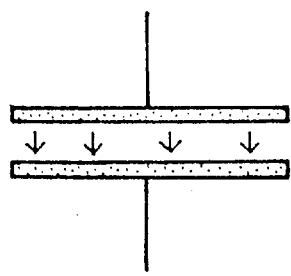
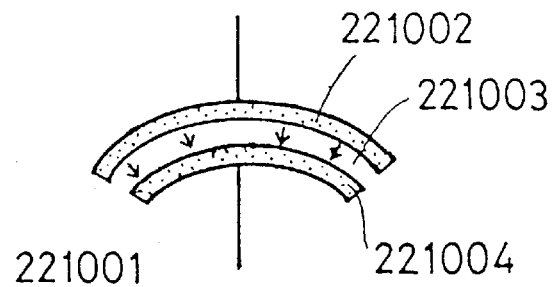
Fig. 22A  Fig. 22B
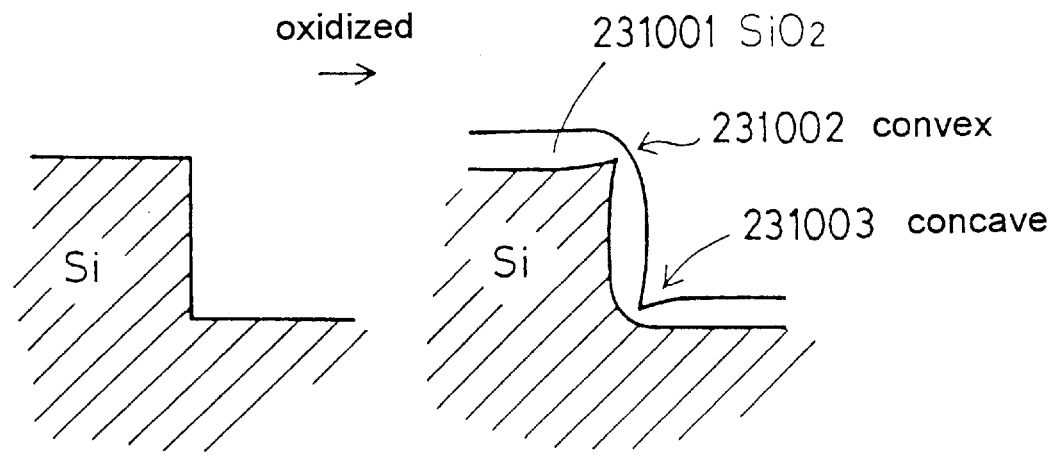
Fig. 23A  Fig. 23B

PROCESS FOR PRODUCING SEMICONDUCTOR DEVICE

BACKGROUND OF THE INVENTION

The present invention relates to a process for producing a MOS-type semiconductor device and a MOS-type semiconductor integrated circuit device.

FIG. 16A is a sectional view of a conventional MOS capacitor element. It is used as a capacitor element of a circuit in a MOS-type or CMOS-type semiconductor integrated circuit device (hereinafter referred to sometimes as "IC").

Since this element is often formed in the same step as the gate oxide film of the MOS transistor of IC, a dielectric film ($SiO_2$ film in this case) which is used as a capacitor is called, for convenience, a gate oxide film (gate $SiO_2$ or gate Ox) 160001. Likewise, an electrode of the capacitor is called a gate electrode (polysilicon gate electrode or gate Poly) 160003. 160002 refers to a region of the gate oxide film (active), 160004 refers to a LOCOS oxide film (LOCOS $SiO_2$ or LOCOS Ox) for separation of elements, 160005 refers to a P$^\pm$-type field dope region for separation of elements (BFD region), and 160006 refers to a P-type (from 2 to 3 Ω·cm, from 20 to 30 Ω·cm) semiconductor substrate. For simplicity, an intermediate insulation film, a wiring metal and the like are omitted.

FIG. 16B is a plan view of FIG. 16A. In this pattern, an active size 160007 is 500 μm.

FIG. 17A is a sectional view of a MOS capacitor element and FIG. 17B is a plan view of FIG. 17A. In a LOCOS oxide film 170004, an active region 170001 is divided into plural islands, which is a structure capable of stressing an influence of a LOCOS edge 170007 (influence on an dielectric breakdown voltage or yield). It is called an "island structure" hereinafter.

Meanwhile, a pattern shown in FIG. 16A is called a "plate pattern".

170004 is a BFD region, 170005 is a substrate, and 170006 is a size (500 μm) of an outermost peripheral active portion (LOCOS edge).

The gate insulation films of the capacitor element and the MOS transistor should both withstand an upper limit (Vdd Max.) of a maximum operational voltage of IC's. Considering TDDB (time dependence dielectric breakdown: durability), a screening test is carried out. For instance, in the case of a product with Vdd Max. of 5 V, the test is conducted at approximately 7 V; in the case of a product with Vdd Max. of 12 V, the test is conducted at approximately 16 V. What matters here is an insufficient dielectric breakdown voltage, namely, a bad dielectric breakdown voltage or yield, of such a gate insulation film of the capacitor or transistor.

In a gate insulation film in a product of 5 V, Gate Tox may be 150 Å or more to adjust an electric field to 3M (mega) V/cm or less considering TDDB. However, in a gate insulation film in a product of 12 V, it has to be 400 Å or more.

That is, for obtaining a necessary capacity value, the capacitor comes to have a large area, and the transistor also comes to have a large area for obtaining a necessary electric current driving ability. Accordingly, a yield becomes poor.

The above-mentioned patterns of the capacitor having the size of 500 μm² (explanation is given through measurement using a test pattern as a monitor of an dielectric breakdown voltage of an oxide film) are arranged, in many cases, in the same semiconductor substrate (in a wafer) for the test. Statistically, a data obtained upon using 100 patterns/wafer may be said to be a reliable data.

In a conventional process for producing a general semiconductor device, a Si single crystal is taken up in the form of an ingot, and then sliced. The thus-sliced disc is called a "wafer". The wafer having usually an oxygen concentration of from $3\times10^{17}/cm^3$ to $12\times10^{17}/cm^3$ undergoes a 1st oxidation step (which is referred to as "1st Ox") and various other steps, and it is changed into a complete wafer having IC incorporated therein. This wafer is divided into chips (dice) in a dicing step, and is then completed through packaging (actual packaging). The above-mentioned steps in the wafer are called "wafer process" in particular, and are ordinarily carried out separately from the steps before or after these steps.

The 1st Ox in the wafer process is generally a first heat treatment step. The 1st Ox and the subsequent general steps of forming a MOS-type semiconductor device (of course, formation of a gate oxide film is conducted on the way) are included in the conventional method.

FIG. 18 is a graph showing a frequency distribution of cumulative number in measuring a dielectric breakdown voltage using a plate pattern of a gate oxide film prepared by the conventional method. The measurement is conducted many times in the wafer using the above-mentioned pattern. Gate Tox is 500 Å. An intensity of an electric field is plotted as the abscissa for generalization. A unit is not described in the ordinate. This is because the graph is to show the state of the distribution. Mode A indicates a deficiency such as a phenomenon close to short-circuiting which is presumably ascribable in general to a dust or the like. Mode B indicates poor dielectric breakdown voltage which is presumably ascribable to an irregular film thickness. Mode C is a so-called intrinsic dielectric breakdown voltage which the oxide film has to exhibit inherently, and which is not deficient. It is ideal that all numbers are to be distributed in mode C (range of from 9 MV/cm to 10 MV/cm may be said to be an intrinsic dielectric breakdown voltage).

Generally, it is difficult to quantitatively discuss such a distribution because of the following parameters.

Dependency on an area (a large area is disadvantageous)
Dependency on a pattern
Dependency on a concentration of a substrate However, the discussion will be given on the basis of the above-mentioned conditions and limitations.

FIG. 19 is the same graph as that in FIG. 18 except that an island pattern is used. The distribution in the island pattern is inferior to that in the plate pattern.

FIG. 20 is a graph showing an average value of a dielectric breakdown voltage of a gate oxide film prepared by the conventional method in relation to dependency on a film thickness.

The values in the various patterns are based on the above-mentioned data.

It is found that the average value of the dielectric breakdown voltage shows the dependency on the film thickness, that the minimum point is provided in the region of from 400 to 500 Å which should be used in IC to operate at 12 V as mentioned above and this is less advantageous, and that even if the thickness is increased to 700 Å or 800 Å, the result is the same as in the thickness of 300 Å.

The results in the island pattern prove to be worse. In view of the area ratio alone, the total area of the island pattern is to be smaller than that of the plate pattern. Accordingly, this is not a mere problem with deficiency due to a dust or the like. This is presumably ascribable to a LOCOS edge.

As described above, in the conventional technique, the yield of the gate oxide film is poor, which influences the yield of IC. Especially, with the film thickness of 400 Å or more, the yield is further decreased. In the pattern having the LOCOS edge, the yield is much worse.

SUMMARY OF THE INVENTION

In order to solve the above-mentioned problems, the present invention has taken the following measures.

In the 1st means, an oxygen concentration at an initial stage (before the wafer process) of a semiconductor substrate (Si wafer) is set at a range of from $14 \times 10^{17}/cm^3$ to $17 \times 10^{17}/cm^3$. Before the 1st oxidation step, the heat treatment is conducted in $N_2$ at a temperature of from 700 to 900° C. for from 30 minutes to 5 hours.

In the 2nd means, BFD (boron field dope) for forming a $P^\pm$-type region on a SiN film being a mask on an active region in forming a LOCOS oxide film is applied to the SiN film at a distance of 0.5 µm or more.

The following functions are obtained upon taking the above-mentioned measures.

When the 1st means is taken, Δ Oi (change in the amount of oxygen of the substrate after undergoing the wafer process) is set at the range of from $5 \times 10^{17}/cm^3$ to $10 \times 10^{17}/cm^3$, thereby greatly improving the dielectric breakdown voltage of the gate oxide film.

When the 2nd means is taken, the dielectric breakdown voltage can be much improved with the gate oxide film having a large number of LOCOS edges. Accordingly, the irregularity of the junction breakdown boltage of $N^+$-$P^\pm$ junction can be also much improved.

BRIEF DESCRIPTION OF THE DRAWINGS

FIG. 5 is a graph showing the relationship between the dielectric breakdown voltage of the oxide film and the film thickness in the semiconductor device in the 1st Example of the present invention;

FIG. 6 is a graph showing the relationship between the dosage of BFD and the dielectric breakdown voltage of the oxide film for explaining a 2nd Example of the present invention;

FIGS. 8A–D are sectional views showing a detailed state of a LOCOS edge in a flow chart of a LOCOS process for explaining the 2nd Example of the present invention;

FIGS. 21A and 21B are flow charts showing a comparison between the process of the present invention and the conventional process, respectively;

FIGS. 22A–B are schematic views of a first model which shows an insufficient dielectric breakdown voltage in the portion A; and FIGS. 23A–B are schematic views of a second model which shows a dielectric breakdown voltage in the portion A.

DESCRIPTION OF THE PREFERRED EMBODIMENTS

Figure 1:
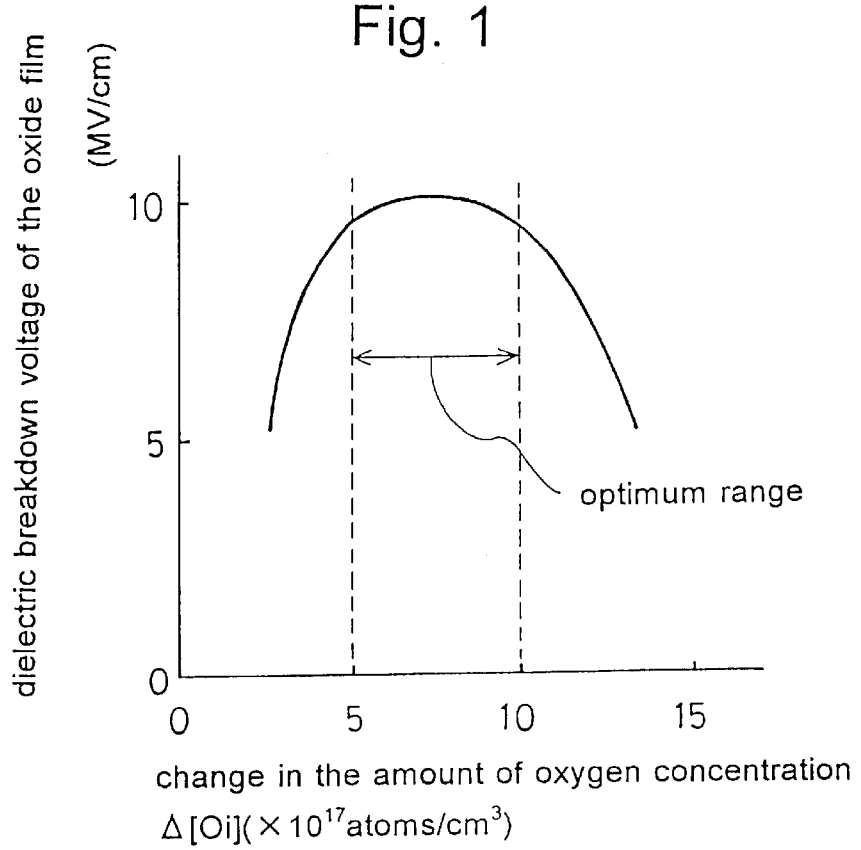
FIG. 1 is a graph showing the relationship between Δ Oi and the dielectric breakdown voltage of the oxide film in a 1st Example of the present invention.

Examples of the present invention will be illustrated specifically by referring to the drawings.

FIG. 1 is a graph showing the relationship between Δ Oi and the dielectric breakdown voltage of the oxide film in a 1st Example of the present invention. The dielectric breakdown voltage of the oxide film is an average value of 100 plate patterns of 500 µm□ for one wafer.

It is found that the range of Δ Oi between $5 \times 10^{17}/cm^3$ and $10 \times 10^{17}/cm^3$ is optimum.

It is found that the relationship between Oi at the initial stage of the substrate and the change in the final concentration of oxygen, α Oi, is represented by the following formula:

$$\Delta[Oi] \alpha f([Oi], \text{"heat treatment"}) \qquad \text{[Expression 1]}$$

heat treatment: in forming an ingot
heat treatment: in the wafer process

Further, the relationship between Δ Oi (not Oi) and the dielectric breakdown voltage of the oxide film is found to be as mentioned above. Still further, the "heat treatment" for obtaining the optimum range of Δ Oi is found as a production method.

Figure 2:
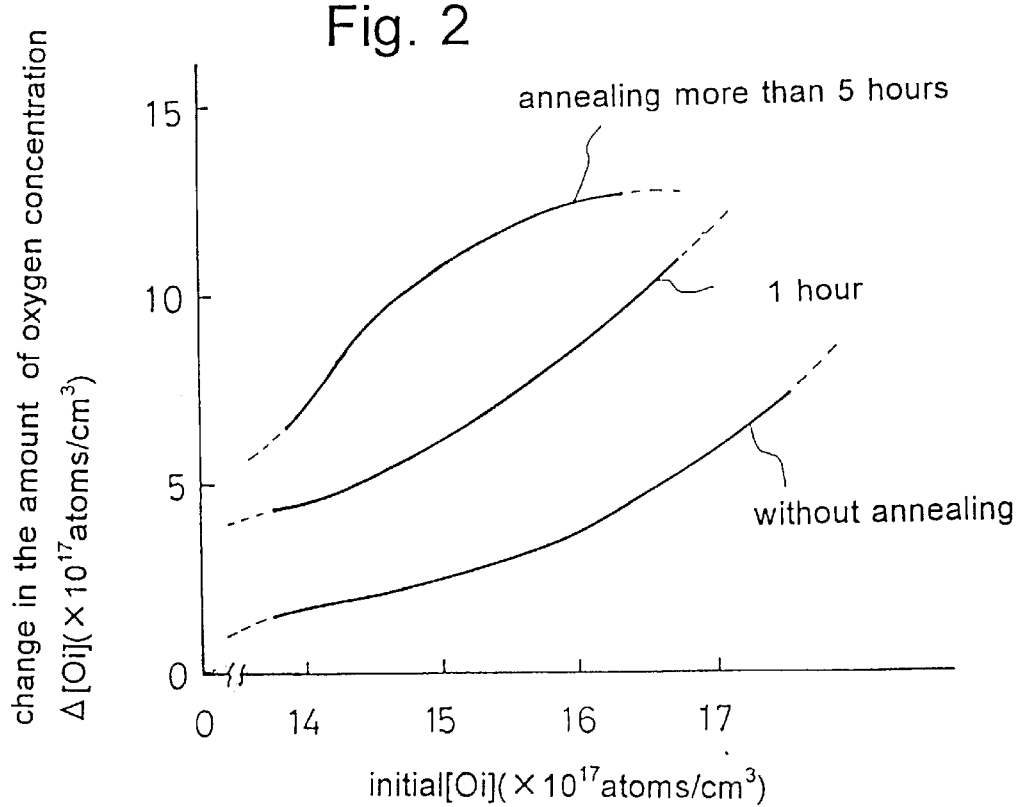
FIG. 2 is a graph showing the relationship between Oi at the initial stage and Δ Oi in the 1st Example of the present invention according to pre-annealing conditions.

FIG. 2 is a graph showing the relationship between Oi at the initial stage and Δ Oi in the 1st Example of the present invention according to pre-annealing conditions.

Annealing 1h indicates pre-annealing (annealing before 1st Ox) in $N_2$ at 800° C. for 1 hour. The increase in Δ Oi is observed according to the annealing time. Δ Oi is dependent on Oi at the initial stage. That is, a method has been found in which Δ Oi is controlled through the temperature and time of heat treatment in an inert gas atmosphere before 1st Ox (first heat treatment in an oxidative atmosphere in the wafer process).

Figure 3:
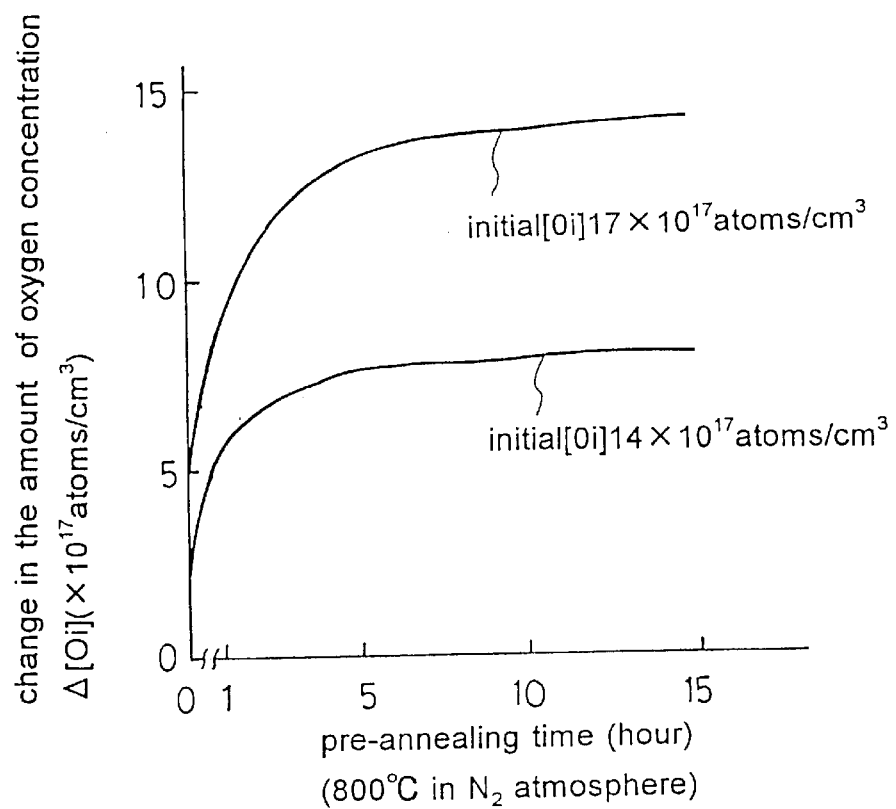
FIG. 3 is a graph showing the relationship between the pre-annealing time and Δ Oi in the 1st Example of the present invention.

FIG. 3 is a graph showing the relationship between the pre-annealing time and Δ Oi in the 1st Example of the present invention.

Δ Oi abruptly rises relative to the pre-annealing time, and when the pre-annealing is conducted for at least 30 minutes, a sufficient value ($5 \times 10^{17}/cm^3$) is reached with Oi of any starting substrate. It is unnecessary to conduct the pre-annealing so long.

Figure 4:
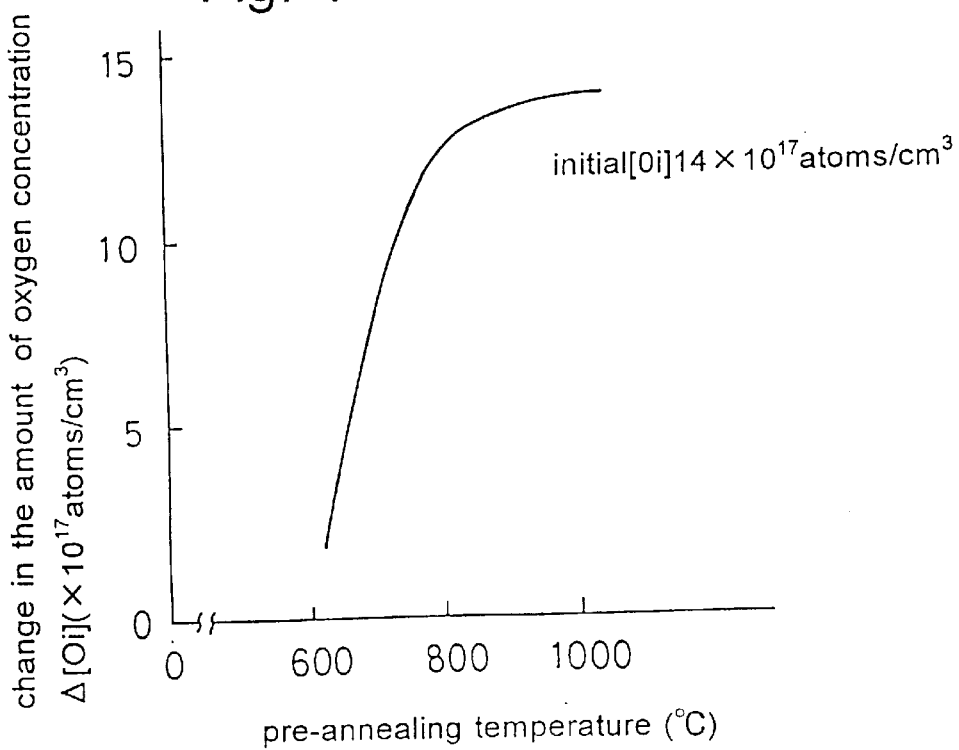
FIG. 4 is a graph showing the relationship between the pre-annealing temperature and Δ Oi in the 1st Example of the present invention.

FIG. 4 is a graph showing the relationship between the pre-annealing temperature and Δ Oi in the 1st Example of the present invention.

Δ Oi abruptly rises at the pre-annealing temperature that exceeds approximately 600° C. It seems unnecessary to conduct the pre-annealing at the temperature of more than 800° C., for example, 900° C. or 1,000° C. Thus, a practical temperature range may be between 700° C. and 900° C. At the temperature of 1,000° C., curving or the like of the wafer seems likely to occur. The temperature of 800° C. is commonly convenient.

FIG. 5 is a graph showing the relationship between the dielectric breakdown voltage of the oxide film and the film thickness in the semiconductor device in the 1st Example of the present invention.

As is apparent upon comparing the plot of the present invention with the conventional plot in the drawing, a great improvement is achieved. The pre-annealing was conducted in $N_2$ at 800° C. for 30 minutes. Thus, the present invention greatly improves the dielectric breakdown voltage of the oxide film which is the capacitor in IC and the dielectric breakdown voltage of the gate oxide film of the transistor, making it possible to improve the yield. Further, the improvement in the region of 400 Å or more is remarkable, and the effects of improvements (yield and qualities) in IC having Vdd Max. 12 V or 24 V can be much expected.

FIGS. 21A–B are flow charts of the process in the Example of the present invention. FIG. 21A is the flow chart of the process of the present invention, and FIG. 21B is that of the conventional process. That is, in the process of the present invention, a substrate having an oxygen concentration Oi of from $14 \times 10^{17}/cm^3$ to $17 \times 10^{17}/cm^3$ is used, and the pre-annealing is conducted in an atmosphere of $N_2$ at 800° C. for 30 minutes. The subsequent steps are the same as those in the conventional process.

FIG. 6 is a graph showing the relationship between the dosage of BFD and the dielectric breakdown voltage of the oxide film for explaining a 2nd Example of the present invention.

The above-mentioned island pattern is used to increase sensitivity. In the drawing, as is apparent from the conventional plot, when the dosage of BFD (in view of $V_{TH}$ of the field transistor, the higher the dosage, the better the separation) increases, the dielectric breakdown voltage of the oxide film decreases. When the BFD dosage exceeds the 13th power, the dielectric breakdown voltage moderately decreases, and the irregularity becomes great at the same time. When the 1st Example of the present invention is applied, the decrease and irregularity are fairly improved, but the tendency is unchanged.

FIGS. 7A–D are sectional views in a basic flow chart of a LOCOS process for explaining the 2nd Example of the present invention.

Figure 7A:
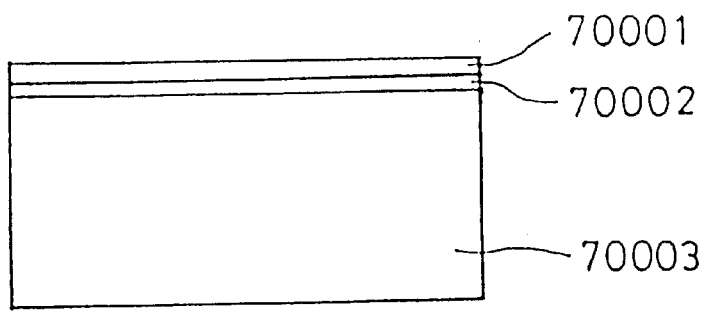
FIGS. 7A–D are sectional views in a basic flow chart of a LOCOS process for explaining the 2nd Example of the present invention.
Figure 7B:
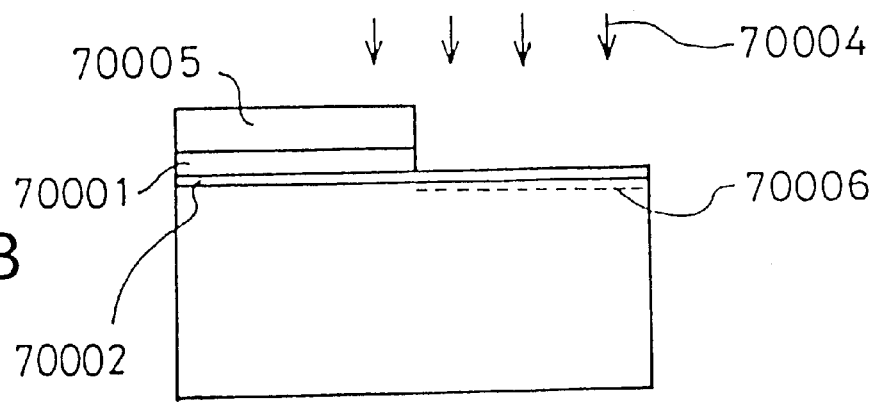

Pad $SiO_2$ 70002 is formed on a Si substrate (in this case, P-type, from 2 to 3 Ω·cm) 70003 to a thickness of 500 Å, and a SiN film 70001 is formed thereon to a thickness of 1,500 Å as shown in FIG. 7A. Then, a pattern is formed on the laminate through a photoresist 70005. BFD ion implantation (boron 30 keV, $7E13/cm^2$) 70004 is conducted while the resist remains intact to obtain a boron implantation layer 70006 as shown in FIG. 7B.

Figure 7C:
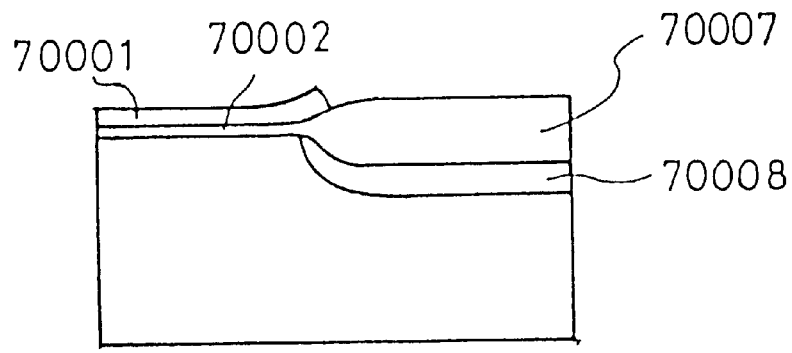

Then, a LOCOS (Local Oxidation of Silicon) oxide film 70007 having a thickness of 1 μm is formed through thermal oxidation at a temperature of from 1,000 to 1,100° C., and BFD forms a $P^\pm$-type region 70008 as shown in FIG. 7C.

Figure 7D:
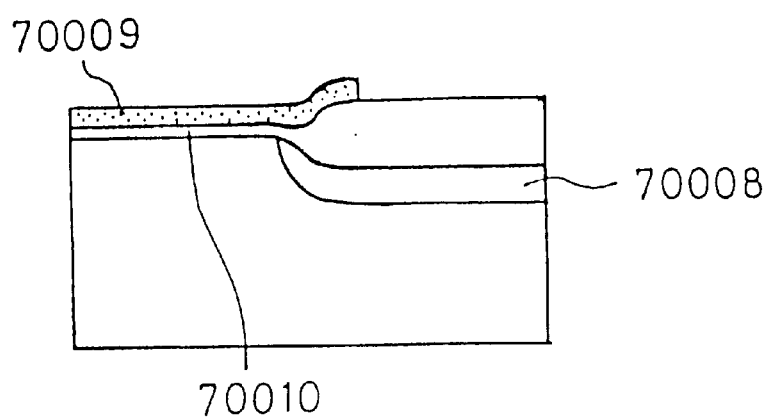

Thereafter, the SiN film is removed, and the Pad $SiO_2$ is removed. Through the gate oxidation, a gate film oxide 70010 and further Poly Si 70009 of a gate electrode are formed as shown in FIG. 7D.

FIGS. 8A–D are sectional views showing a detailed state of a LOCOS edge in a flow chart of a LOCOS process for explaining the 2nd Example of the present invention.

Figure 8A:
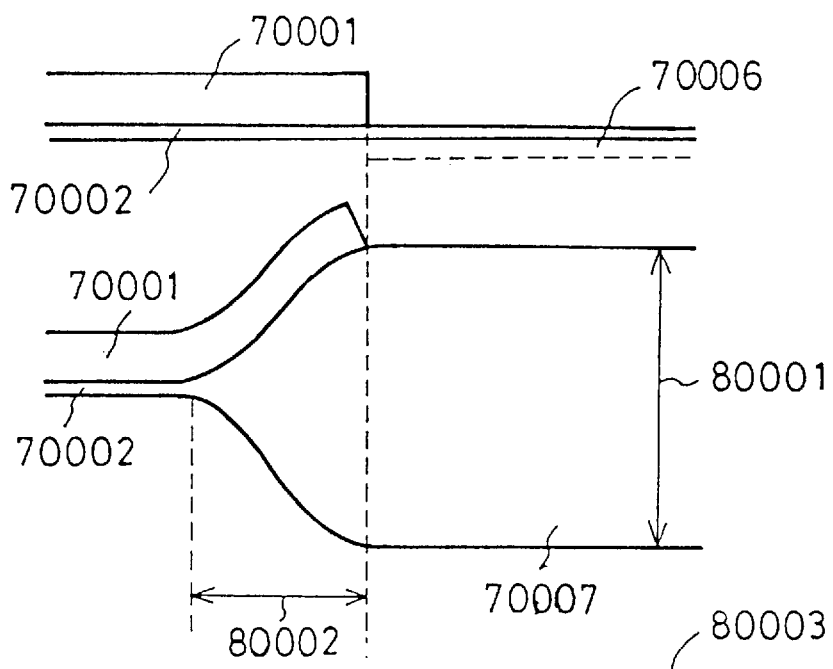
Figure 8C:
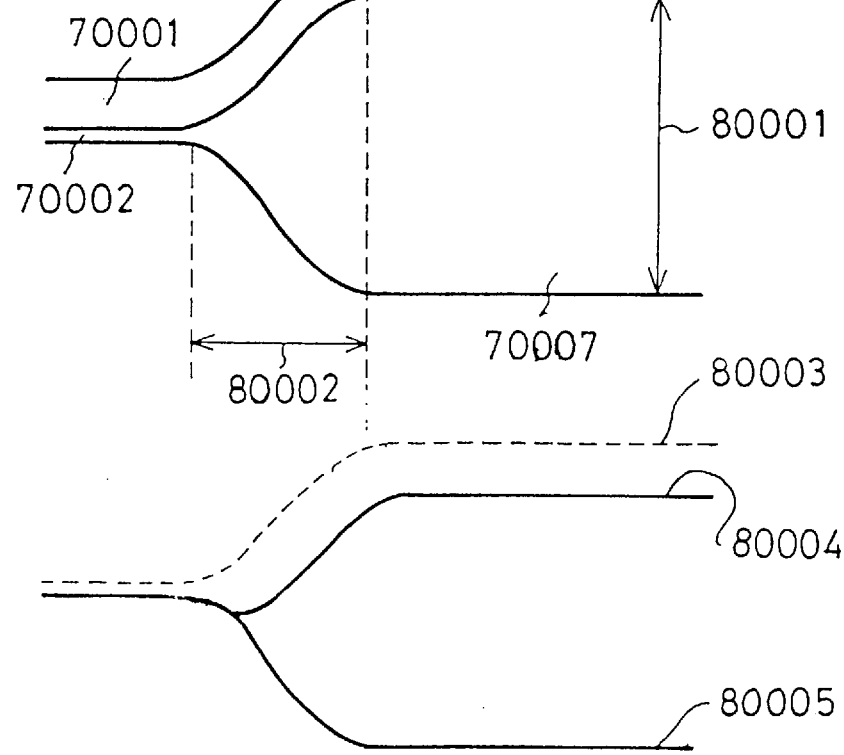

SiN 70001 is patterned, and the BFD implantation layer 70006 is formed as shown in FIG. 8A. Then, LOCOS oxidation is conducted to form a LOCOS oxide film ($SiO_2$) 70007 having a LOCOS Ox thickness 80001 of 1 μm. Biting of the oxide film under the SiN film 70001 which is called "bird's beak" occurs as shown in FIG. 8B. Subsequently, the SiN film is removed, and the Pad $SiO_2$ is removed. Then, the film is reduced from the original LOCOS $SiO_2$ surface (interface) 80003 to obtain a new LOCOS $SiO_2$ surface (interface) 80004 as shown in FIG. 8C. 80005 is a Si interface.

Figure 8D:
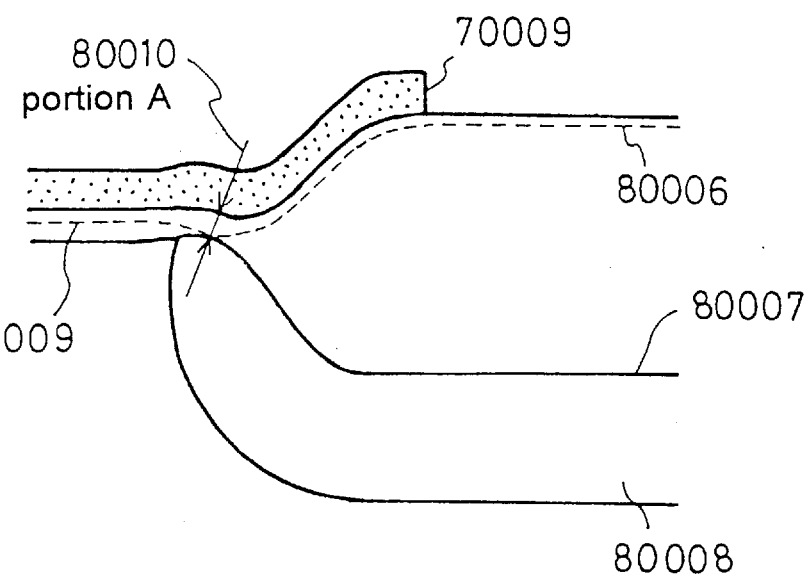

Thereafter, gate oxidation (500 Å) is conducted, and formation of gate Poly 70009 is carried out to obtain what is shown in FIG. 8D. From the above-mentioned flow chart, it becomes apparent that a portion A has a gently convex section. This portion seems likely to influence the dielectric breakdown voltage. The mechanism thereof has not been completely elucidated, but the following two facts are considered at present.

FIG. 22 is a schematic view of a first model which shows an insufficient dielectric breakdown voltage in the portion A. When a condenser structure shown in FIG. 22A is curved as shown in 22B, an area of an upper electrode 221002 is unchanged but an area of a lower electrode 221004 is decreased. At the same voltage and electric field, an electric field 112001 to be applied to a dielectric 112003 near the lower electrode is thought to be higher. Accordingly, this seems likely to lead to the decrease in the dielectric breakdown voltage and the decrease in the yield.

FIG. 23 is a schematic view of a second model which shows an insufficient dielectric breakdown voltage in the portion A. When a stepped Si portion as shown in FIG. 23A is oxidized, the result is as shown in FIG. 23B. A convex corner 231002 and a concave corner 231003 of $SiO_2$ 231001 become thinner. The portion A corresponds to the raised corner 231002 where $SiO_2$ is thinner, which seems likely to decrease the dielectric breakdown voltage and the yield.

Further, it becomes clear that a $P^\pm$-type region 80008 formed of BFD covers the portion A. Accordingly, it is understandable from this fact that the island pattern is more dependent on BFD as shown in FIG. 6. 80009 is a Si interface before gate Ox, 80007 is a final Si interface after the gate Ox, and a dotted line 80006 is a SiO$_2$ interface before the gate Ox.

Figure 9:
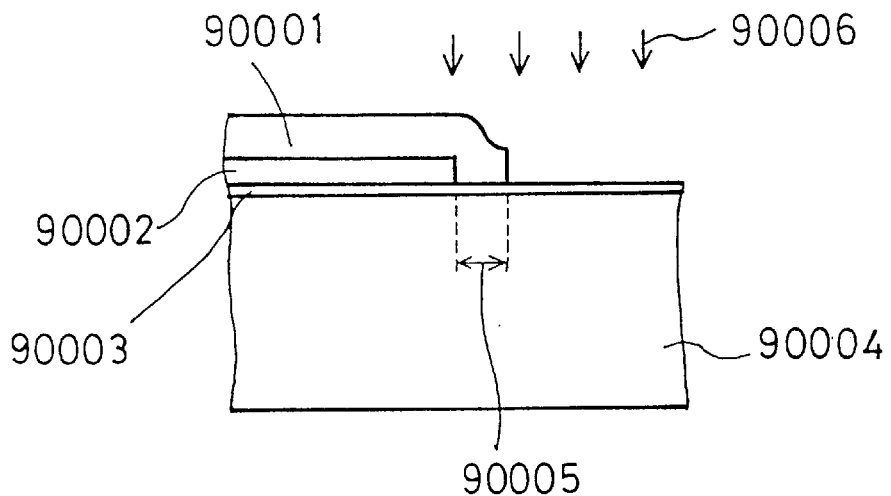
FIG. 9 is a sectional view showing a 1st process for producing the semiconductor device in the 2nd Example of the present invention.

FIG. 9 is a sectional view showing a 1st process for producing the semiconductor device in the 2nd Example of the present invention. Heretofore, boron ions were implanted while a resist through which SiN was patterned remained intact (for fear that boron might penetrate therethrough). In the process of the 2nd Example of the present invention, the resist used to pattern SiN is delaminated, and a photoresist 90001 is used in patterning again. At that time, an overlap size 90005 is set at 0.5 µm or more. The overlap size may be several micrometers over 0.5 µm. However, from the standpoint of a technological principle in this Example, scores or hundreds of micrometers are available. Actually, if the overlap size is scores of micrometers, the size of the chip increases in view of the total size of IC. Therefore, several micrometers are said to be an ordinary size. As will be later described, when an N$^+$-P$^\pm$ junction is formed, a junction breakdown boltage is not raised so much in some portion (for example, junction for protection of ESD stress). Therefore, such a limitation is imposed. 90002 is a SiN film (1,500 Å), 90003 is Pad SiO$_2$ (500 Å), 90006 is boron implantation (BFD: 30 keV, 7×10$^{13}$/ cm$^2$), and 90004 is a Si substrate (P-type, from 2 to 3 Ω·cm).

Figure 10:
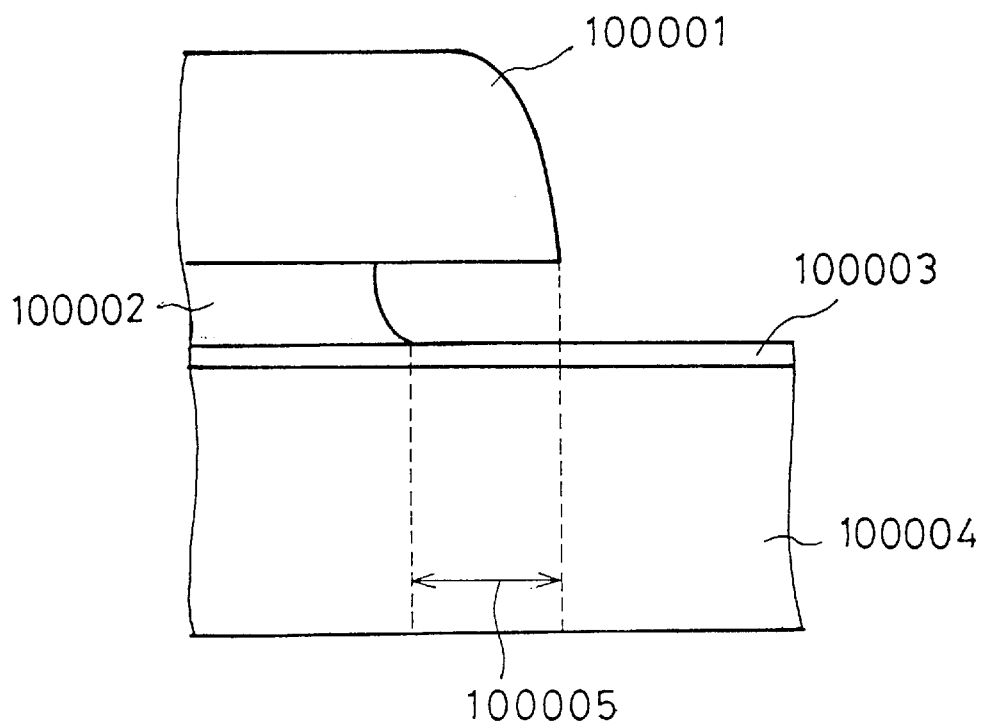
FIG. 10 is a sectional view showing a the 2nd process for producing the semiconductor device in the 2nd Example of the present invention.

FIG. 10 is a sectional view showing a 2nd process for producing the semiconductor device in the 2nd Example of the present invention.

At the time of etching a SiN film 100002, highly isotropic etching is conducted, and a sandwich size 100005 is set at 0.5 µm or more. 100004 is a Si substrate, and 100003 is Pad SiO$_2$.

In the other process, not shown, after patterning the SiN film, for example, CVD SiO$_2$ is deposited, and the film is etched with RIE to form a spacer. This process provides the same effect.

Figure 11:
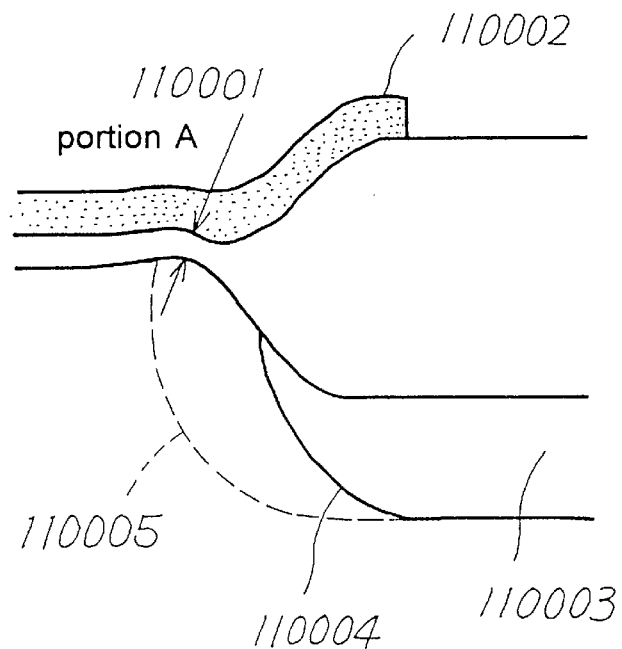
FIG. 11 is a sectional view of a LOCOS edge of the gate oxide film in the semiconductor device in the 2nd Example of the present invention.

FIG. 11 is a sectional view of a LOCOS edge of the gate oxide film in the semiconductor device in the 2nd Example of the present invention.

It is seen that a (raised) portion A 110001 is situated outside the P$^\pm$-type region interface in the 2nd Example of the present invention relative to the conventional P$^\pm$-type region interface 110005 (which means that the portion A is not situated on the P$^\pm$-type region). 110002 is gate Poly, and 110003 is a P$^\pm$-type region in the 2nd Example of the present invention.

Figure 12:
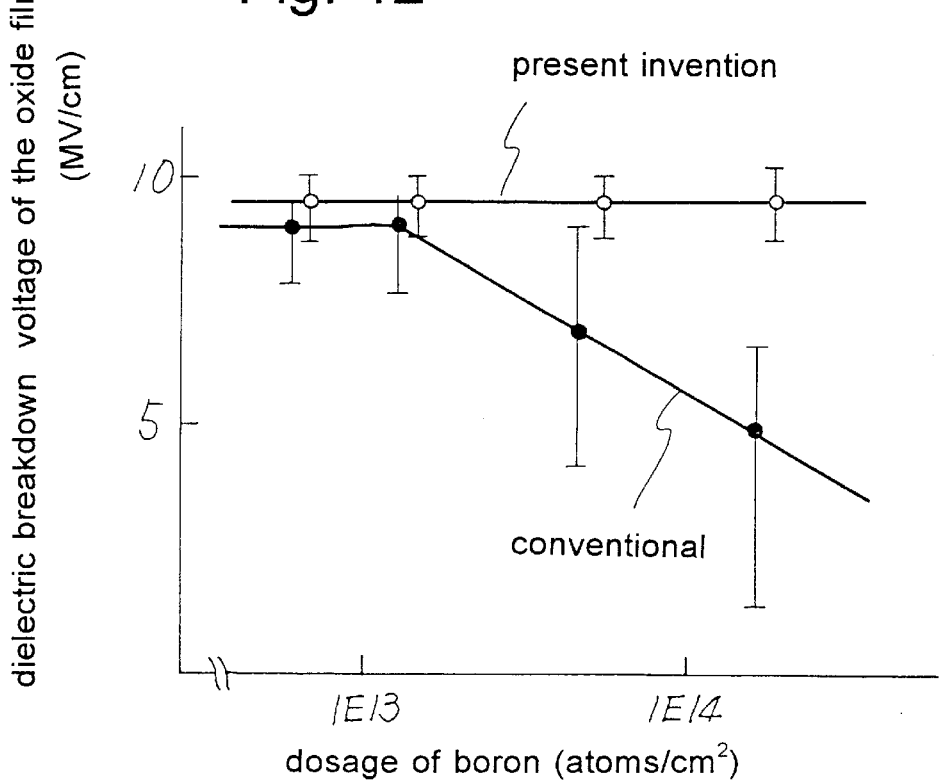
FIG. 12 is a graph showing the relationship between the BFD dosage and the dielectric breakdown voltage of the oxide film in the semiconductor device in the 2nd Example of the present invention.

FIG. 12 is a graph showing the relationship between the BFD dosage and the dielectric breakdown voltage of the oxide film in the semiconductor device in the 2nd Example of the present invention.

In comparison to the conventional plot, the plot in the 2nd Example of the present invention (which is conducted along with 1st Example) shows that even if the BFD dosage is increased to more than the 14th power, the dielectric breakdown voltage is not decreased at all, and that the increase in the irregularity of the dielectric breakdown voltage is suppressed.

Figure 13:
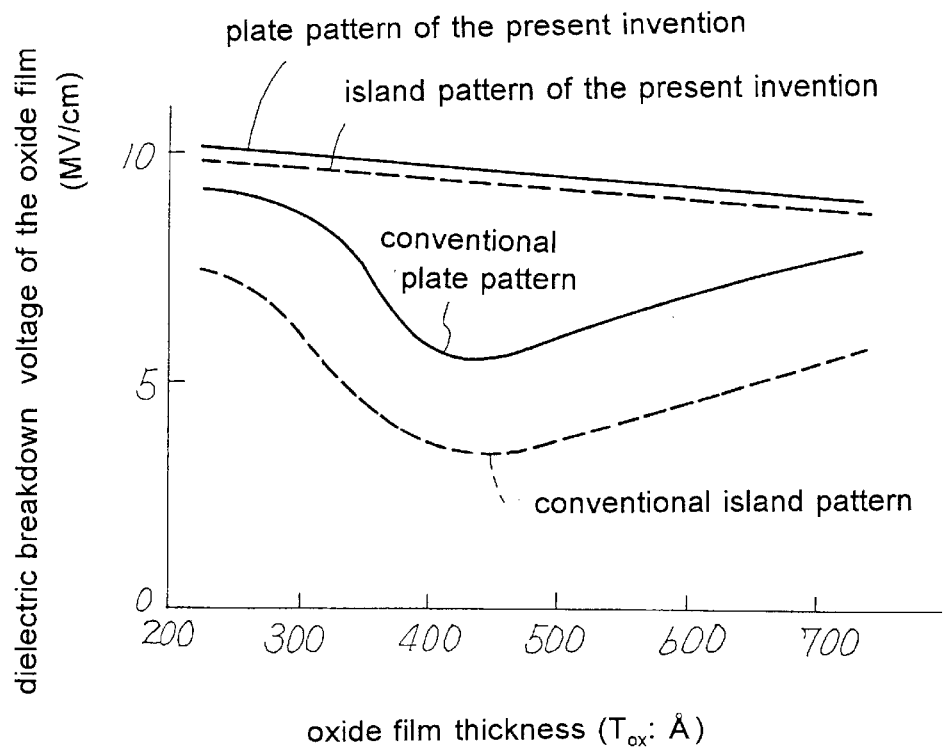
FIG. 13 is a graph showing the relationship between the dielectric breakdown voltage of the oxide film and the film thickness in the semiconductor device in the 2nd Example of the present invention.

FIG. 13 is a graph showing the relationship between the dielectric breakdown voltage of the oxide film and the film thickness in the semiconductor device in the 2nd Example of the present invention.

As is clearly seen upon looking at the plot of the island pattern in the 2nd Example of the present invention (which is conducted along with the 1st Example), the island pattern exhibits as good a dielectric breakdown voltage as the plate pattern.

Figure 14:
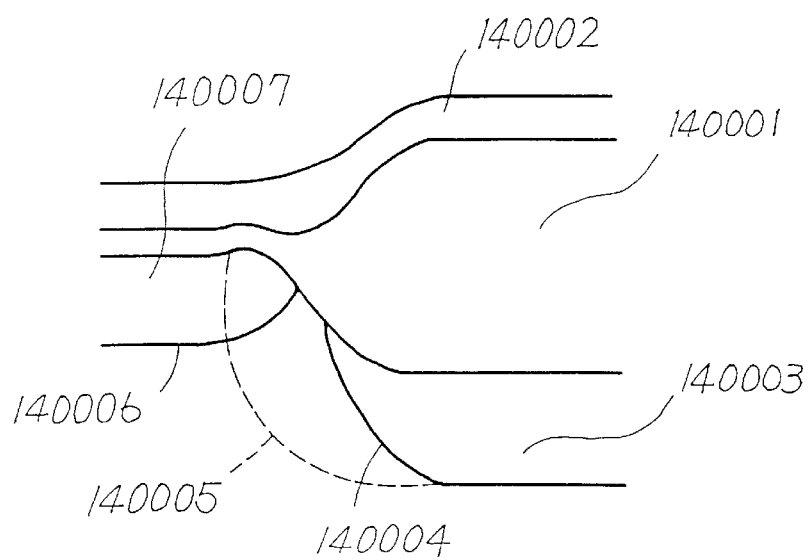
FIG. 14 is a sectional view of a $N^+$-$P^\pm$ junction LOCOS edge in the semiconductor device in the 2nd Example of the present invention.

FIG. 14 is a sectional view of a N$^+$-P$^\pm$ junction LOCOS edge in the semiconductor device in the 2nd Example of the present invention. The N$^+$-P$^\pm$ junction composed of an interface 140006 of a N$^+$-type region 140007 and an interface 140004 of a P$^\pm$-type region 140003 in the present invention, unlike that composed of an interface 140005 of a conventional P$^\pm$-type region, does not cause overlapping. An intermediate insulation layer 140002 is formed on LOCOS SiO$_2$ 140001, and a P$^\pm$-type region 140003 is formed thereunder. Other structures such as an electrode and the like are also omitted here.

Figure 15:
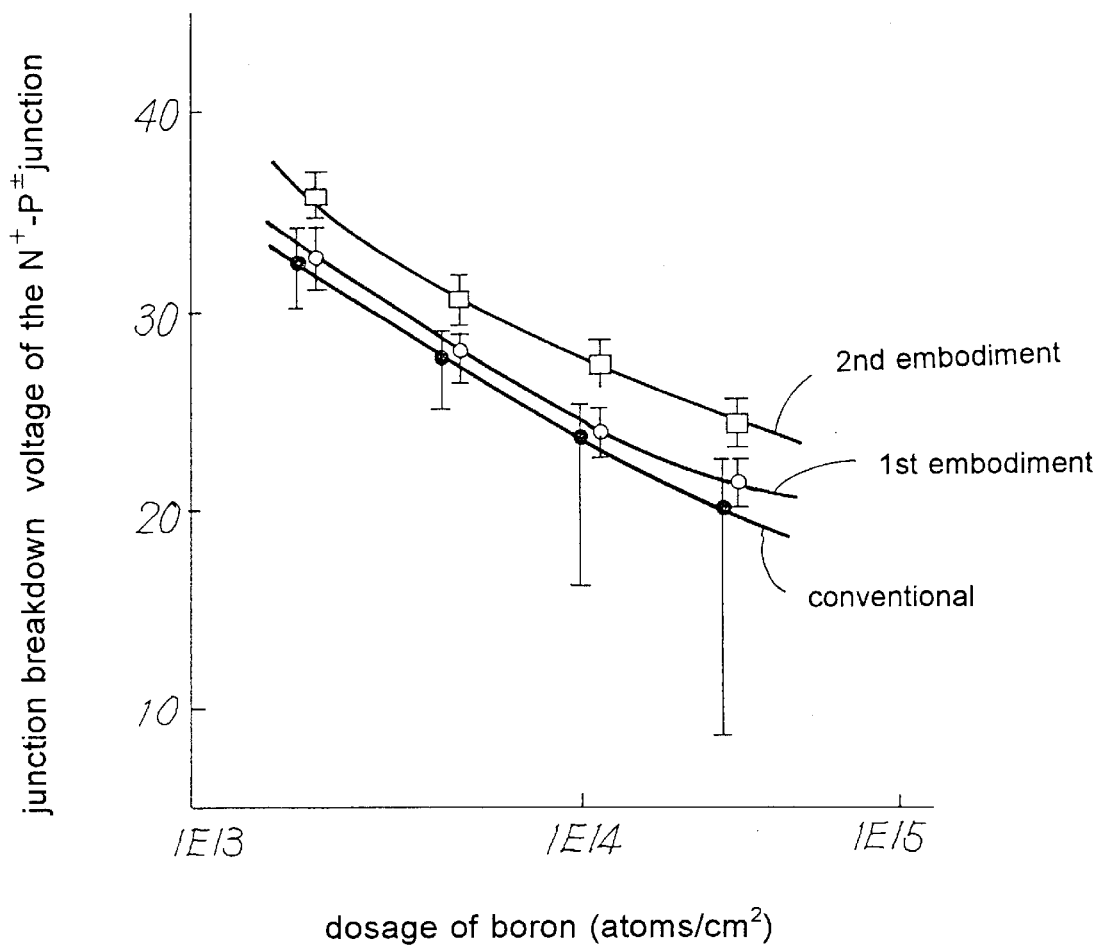
FIG. 15 is a graph showing the relationship between the BFD dosage and the junction breakdown boltage of the $N^+$-$P^\pm$ junction in the semiconductor device in the 2nd Example of the present invention.
Figure 16A:
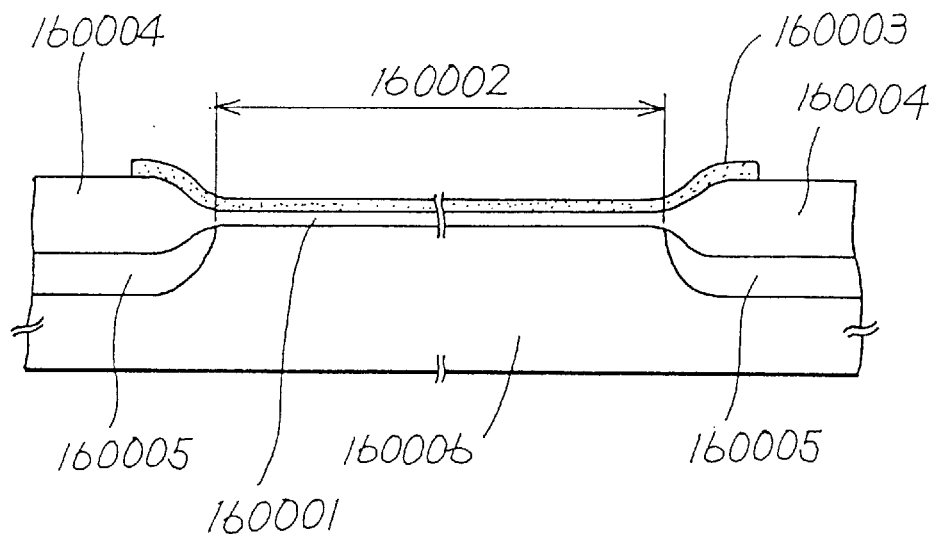
FIG. 16A is a sectional view of a conventional MOS capacitor element.
Figure 16B:
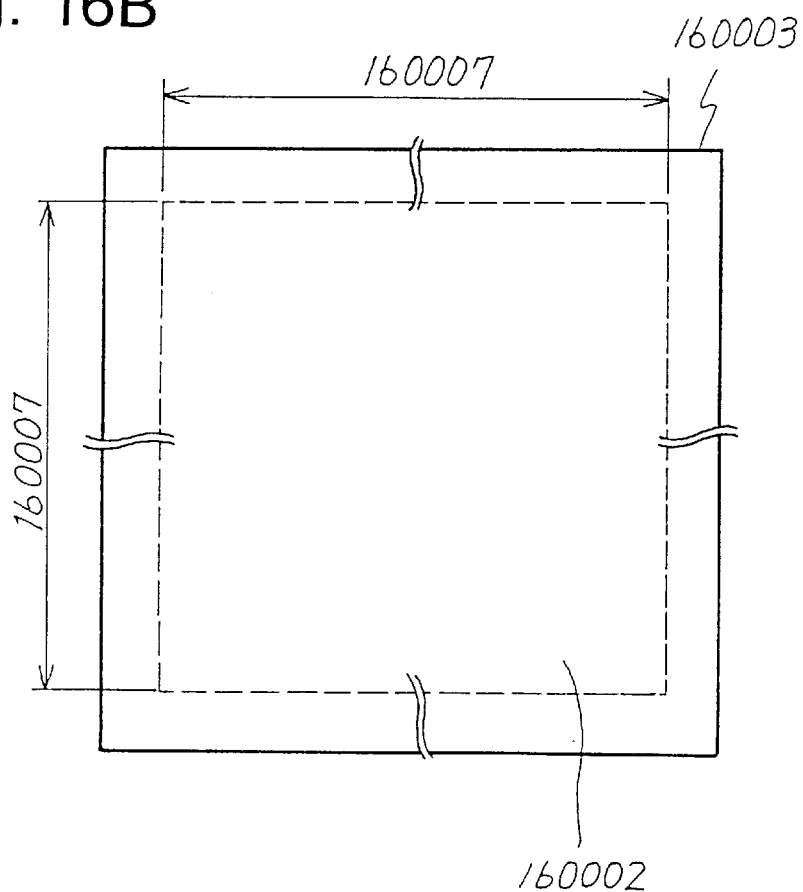
FIG. 16B is a plan view of FIG. 16A.
Figure 17A:
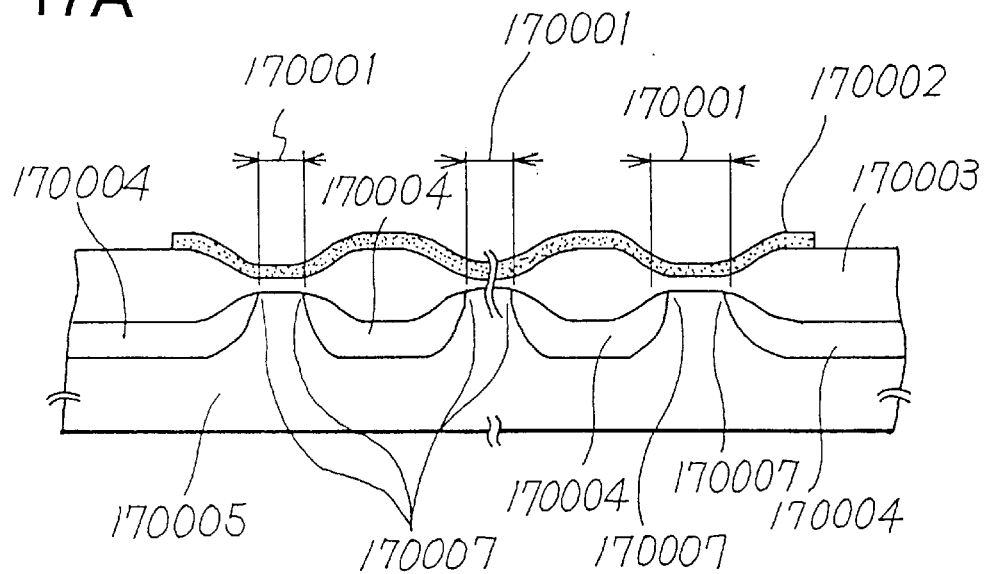
FIG. 17A is a sectional view of the conventional MOS capacitor element and FIG. 17B is a plan view of FIG. 17B.
Figure 17B:
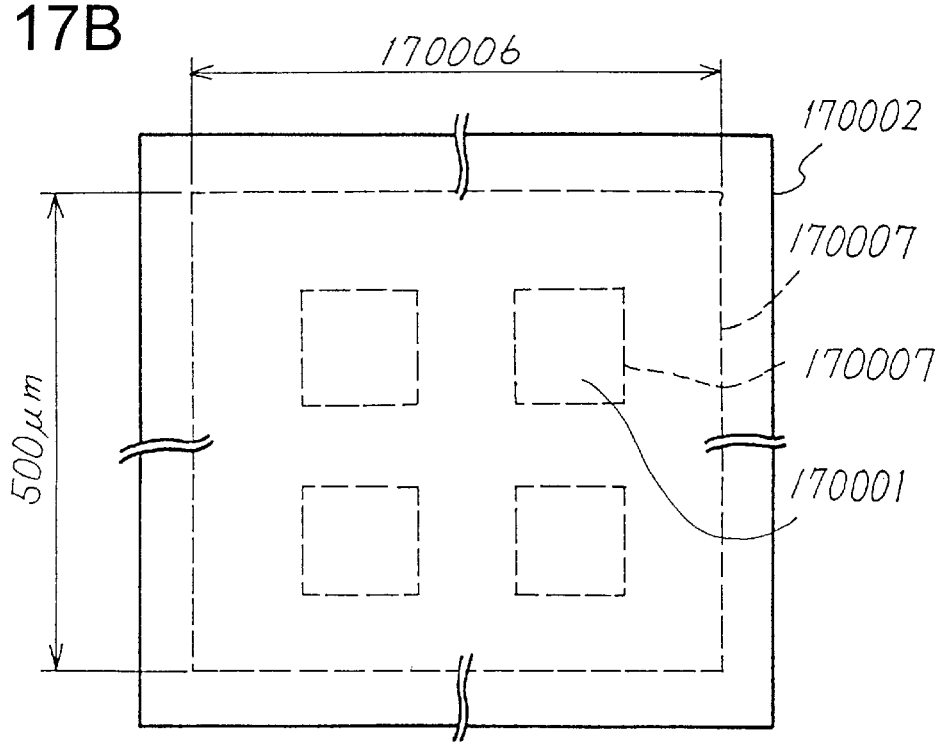
Figure 18:
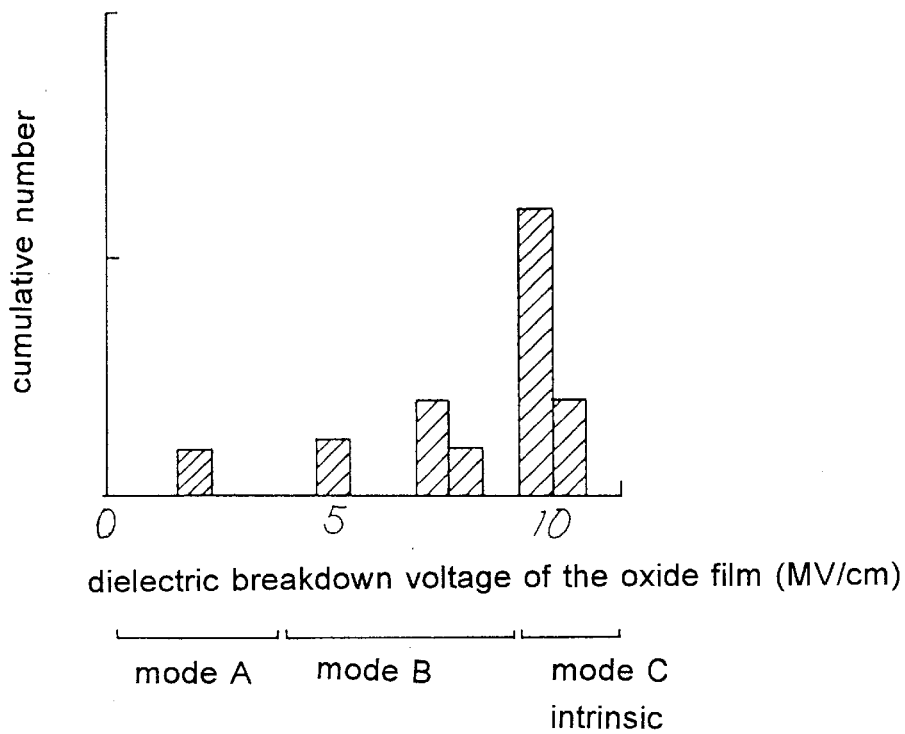
FIG. 18 is a graph showing a frequency distribution of cumulative number in measuring a dielectric breakdown voltage using a plate pattern of a gate oxide film prepared by the conventional method.
Figure 19:
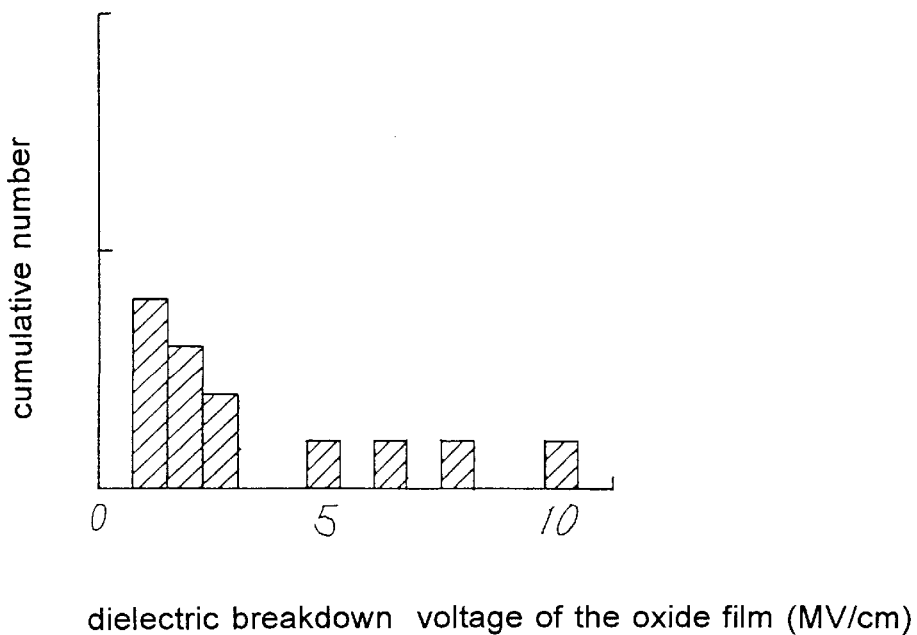
FIG. 19 is a graph showing the frequency distribution of cumulative number in measuring the dielectric breakdown voltage using an island pattern.
Figure 20:
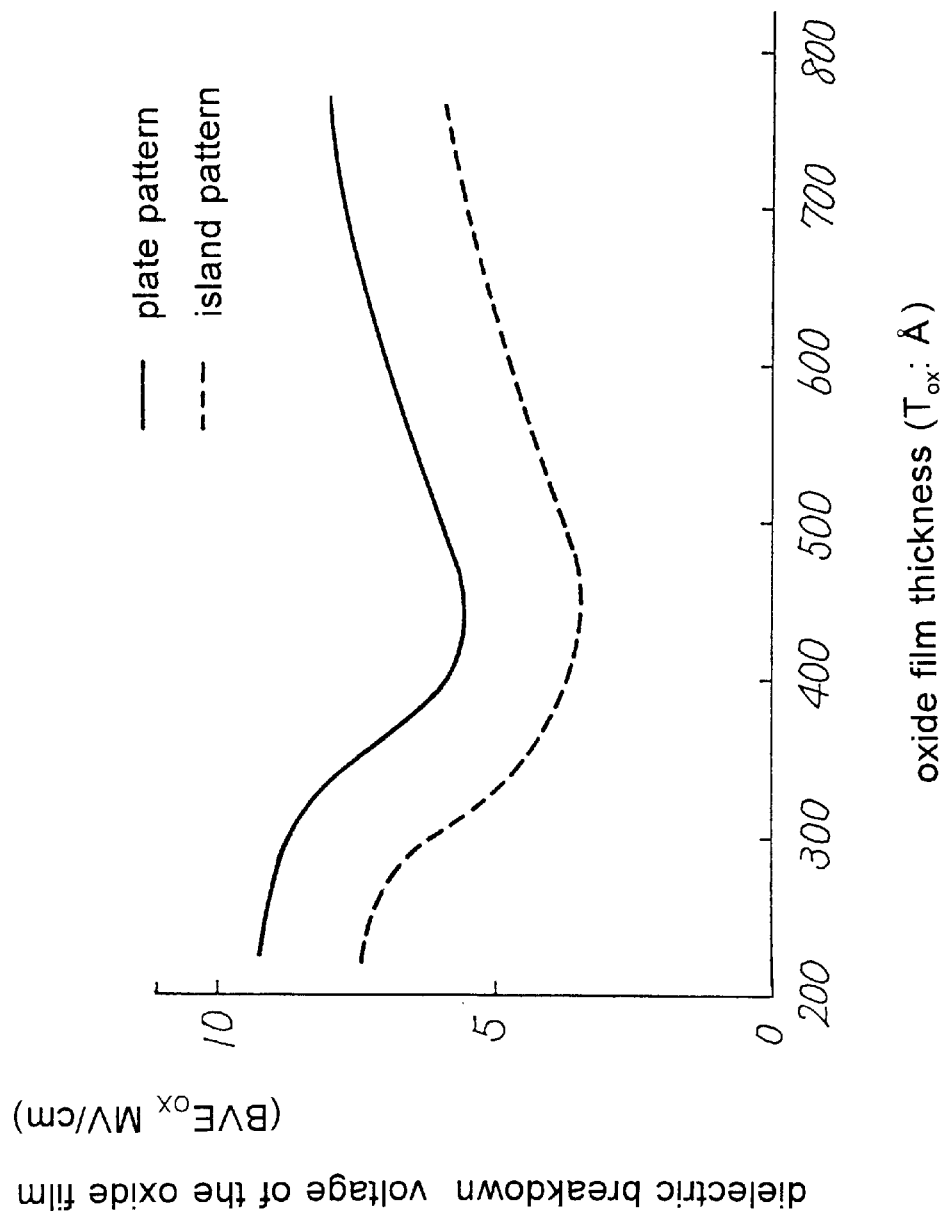
FIG. 20 is a graph showing an average value of a dielectric breakdown voltage of a gate oxide film prepared by the conventional method in relation to dependency on a film thickness.

FIG. 15 is a graph showing the relationship between the BFD dosage and the junction breakdown boltage of the N$^+$-P$^\pm$ junction in the semiconductor device in the 2nd Example of the present invention. In comparison to the conventional plot, the irregularity is greatly improved in the plot in the 1st Example. The plot is slightly slid for easy observation. In addition to the 1st Example, the 2nd Example is conducted with the same absolute value except for the irregularity. As a result, the junction breakdown voltage is shifted higher. This graph illustrates the plot in which the N$^+$-P$^\pm$ junction is approximately 0.5 µm spaced apart. When the distance is increased, the junction breakdown voltage is shifted even higher. However, it is not necessarily good that the junction breakdown voltage is increased. The junction breakdown voltage may be determined as required. This is because ESD is related therewith.

As has been described above, the present invention can form an oxide film having quite an excellent dielectric breakdown voltage and realize production of a semiconductor device having a high yield and high qualities. The higher the upper limit (12 V or 24 V) of the operational voltage IC's, the more effective the semiconductor device is.

What is claimed is:

1. A process for producing a semiconductor device, comprising the steps of: heat-treating a silicon substrate having an oxygen concentration of 14×10$^{17}$/cm$^3$ to 17×10$^{17}$/cm$^3$ in an inert gas to change the oxygen concentration of the silicon substrate to within a range of 5×10$^{17}$/cm$^3$ to 10×10$^{17}$/cm$^3$; and thereafter heat-treating the silicon substrate in an oxidative atmosphere.

2. A process for producing a semiconductor device, comprising the steps of: heat-treating a silicon substrate having an oxygen concentration of 14×10$^{17}$\cm$^3$ to 17×10$^{17}$/cm$^3$ in an inert gas at a temperature of 700° C. to 1,000° C.; and thereafter heat-treating the silicon substrate in an oxidative atmosphere.

3. A process according to claim 1; wherein the heat treatment in the inert gas is conducted for 30 minutes to 5 hours.

4. A process for producing a semiconductor device, comprising the steps of: forming a silicon oxide film on a silicon substrate having an oxygen concentration of 14×10$^{17}$/cm$^3$ to 17×10$^{17}$/cm$^3$; forming a silicon nitride film on the silicon oxide film; removing a part of the silicon nitride film; and introducing a boron element into the silicon substrate at a portion thereof which is spaced apart by at least 0.5 µm from an end of the silicon nitride film in a planar direction of the silicon substrate.

5. A process for producing a semiconductor device, comprising the steps of: heat-treating an oxygen-containing silicon substrate in an inert atmosphere to change a concentration of oxygen contained in the silicon substrate to within a range of 5×10$^{17}$/cm$^3$ to 10×10$^{17}$/cm$^3$; and heat-treating the silicon substrate in an oxidative atmosphere to form a silicon oxide film on a surface of the silicon substrate having an improved dielectric breakdown voltage.

6. A process as claimed in claim 5; wherein the initial oxygen concentration of the silicon substrate prior to heat-treating in the inert atmosphere is between $14 \times 10^{17}/cm^3$ and $17 \times 10^{17}/cm^3$.

7. A process as claimed in claim 5; wherein the heat treatment in the inert atmosphere is conducted at a temperature of 700° C. to 1,000° C. for a period of 0.5 hour to 5 hours.

8. A process as claimed in claim 5; including forming an electrode on the silicon oxide film to form a capacitor element having the silicon oxide film.

9. A process as claimed in claim 5; wherein the silicon oxide film comprises a gate insulation film; and including the step of forming a gate electrode on the silicon oxide film to form a MOS-type transistor.

10. A process as claimed in claim 5; including the step of forming a silicon nitride film on a surface of the silicon oxide film, pattering the silicon nitride film, covering an edge of the patterned silicon nitride film, forming a masking material on a portion of the surface of the silicon substrate which is spaced at least approximately 0.5 μm from the edge of the patterned silicon nitride film, injecting impurities into the silicon substrate, and heat-treating the silicon substrate in the oxidative atmosphere to form a LOCOS oxide film.

11. A process as claimed in claim 5; wherein the heat treatment in the inert gas is conducted at a temperature of 700° C. to 1,000° C.

12. A process for producing a semiconductor device, comprising the steps of: providing a silicon substrate having a given oxygen concentration; subjecting the silicon substrate to a first heat treatment in an inert atmosphere to change the given oxygen concentration of the silicon substrate to $5 \times 10^{17}/cm^3$ to $10 \times 10^{17}/cm^3$; and thereafter subjecting the silicon substrate to a second heat treatment in an oxidative atmosphere.

13. A process as claimed in claim 12; including conducting the first heat treatment at a temperature of 700° C. to 1,000° C.

14. A process as claimed in claim 12; including conducting the first heat treatment for a period of 0.5 hour to 5 hours.

15. A process as claimed in claim 12; wherein the preselected oxygen concentration of the silicon substrate is $14 \times 10^{17}/cm^3$ to $17 \times 10^{17}/cm^3$.

* * * * *